United States Patent
Lou et al.

(10) Patent No.: US 7,969,340 B2
(45) Date of Patent: Jun. 28, 2011

(54) NOISE-SHAPED SEGMENTED DIGITAL-TO-ANALOG CONVERTER

(75) Inventors: Chih-hong Lou, Jiaosi Township (TW); Kuan-hung Chen, Wugu Township (TW); Stacy Ho, Reading, MA (US)

(73) Assignee: Mediatek Inc., Hsin-Chu (TW)

( * ) Notice: Subject to any disclaimer, the term of this patent is extended or adjusted under 35 U.S.C. 154(b) by 35 days.

(21) Appl. No.: 12/507,454

(22) Filed: Jul. 22, 2009

(65) Prior Publication Data

US 2011/0018753 A1 Jan. 27, 2011

(51) Int. Cl.
*H03M 3/00* (2006.01)
(52) U.S. Cl. .......................... 341/143; 341/144
(58) Field of Classification Search .................. 341/143, 341/144, 145
See application file for complete search history.

(56) References Cited

U.S. PATENT DOCUMENTS 5,977,899 A * 11/1999 Adams .......................... 341/145

OTHER PUBLICATIONS

"A 113-dB SNR oversampled DAC with segmented noise-shaped scrambling,"IEEE J. Solid State Circuits, vol. 33, No. 12, pp. 1871, Dec. 1998.

* cited by examiner

*Primary Examiner* — Joseph Lauture
(74) *Attorney, Agent, or Firm* — Kirton & McConkie; Evan R. Witt

(57) ABSTRACT

A segmented digital-to-analog converter (DAC) is disclosed. In the present invention, the segmented DAC of the present invention comprises a signal component processing stage and a plurality of noise component processing stages cascaded with the signal component processing stage. A noise component of an input word for the DAC is split into a plurality of portions to be processed. By doing so, effect due to gain mismatch(es) in an analog portion of the DAC can be effectively reduced without significantly increasing DAC cells used in the DAC.

17 Claims, 3 Drawing Sheets

NOISE-SHAPED SEGMENTED DIGITAL-TO-ANALOG CONVERTER

TECHNICAL FIELD OF THE INVENTION

The present invention relates to a digital-to-analog converter (DAC), more particularly, to a nose-shaped segmented DAC.

BACKGROUND OF THE INVENTION

Digital-to-analog converters (DACs) are widely used in various fields. Among different types of DACs, a sigma-delta, or noise shaped DAC is applied to widespread use. To reduce the required number of analog elements used in the DAC, a plurality of sub-DACs are used rather than a signal DAC with $2^N$ levels. That is, a segmented DAC is used. The DAC converts N binary-weighted bits into M equally-weighted bits, where $M=2^N$.

FIG. 1 is a block diagram schematically showing a prior art segmented DAC 10. As shown, an input word Xin of 20 bits is quantized by a digital modulator 12 into a low-bit word Xm. In this example, the digital modulator 10 is implemented by a 6-bit sigma-delta modulator, so that the input word Xin is modulated into a 6-bit word Xm. The 6-bit word Xm is split into three most significant bits (MSBs) and three least significant bits (LSBs). The three LSBs are converted into eight equally-weighted bits by a thermometer encoder 21 and randomly scrambled by a scrambler 25. The three MSBs are converted into eight equally-weighted bits by a thermometer encoder 31 and the equally-weighted bits are randomly scrambled into scrambled bits by a scrambler 35. Since one MSB bit is equivalent to 8 times of one LSB bit, the MSBs and LSBs are respectively converted by a DAC 29 (8×) and a DAC 39 (1×). That is, a bit weight ratio of the outputs of the DAC 29 and DAC 39 is 8:1. Then the outputs of the DAC 29 and the DAC 39 are summed by a summing unit 40. Ideally, the output of the summing unit 40 should be an analog value that equals to the 6-bit digital word Xm.

However, since the outputs of the DAC 29 and DAC 39 are summed in an analog manner, errors resulting from gain mismatch between the DAC 29 and the DAC 39 cause in-band noise and distortion. Therefore, an in-band signal-to-noise ratio (SNR) and total-harmonic-distortion (THD) of the DAC will be degraded.

SUMMARY OF THE INVENTION

The present invention is to provide a segmented digital-to-analog converter (DAC), in which effect due to gain mismatch (es) in an analog portion of the DAC can be effectively reduced without significantly increasing analog elements (i.e. DAC cells) used in the DAC.

The segmented DAC of the present invention comprises a signal component processing stage and a plurality of noise component processing stages cascaded with the signal component processing stage. The signal component processing stage is a preceding stage with respect to the first one of the noise component processing stages. The signal component processing stage has a digital modulator for generating a signal word (Xm) in response to an input word (Xin) and a DAC unit for converting the signal word to generate an analog value. Each noise component processing stage comprises a digital modulator for generating a noise word (Rm) in response to a residue word (R) obtained by subtracting an output of the digital modulator of the preceding stage from an input of a preceding stage, and a DAC unit for converting the noise word to generate an analog value, while the last one of the noise component processing stages further comprises another DAC unit for converting a residue obtained by subtracting an output of the digital modulator of the preceding stage from an input of the preceding stage to generate an analog value. The segmented DAC further has a summing unit for summing all the analog values to generate an output analog value.

BRIEF DESCRIPTION OF THE DRAWINGS

The present invention will be described in detail in conjunction with the appending drawings, in which.

DETAILED DESCRIPTION OF THE INVENTION

Figure 1:
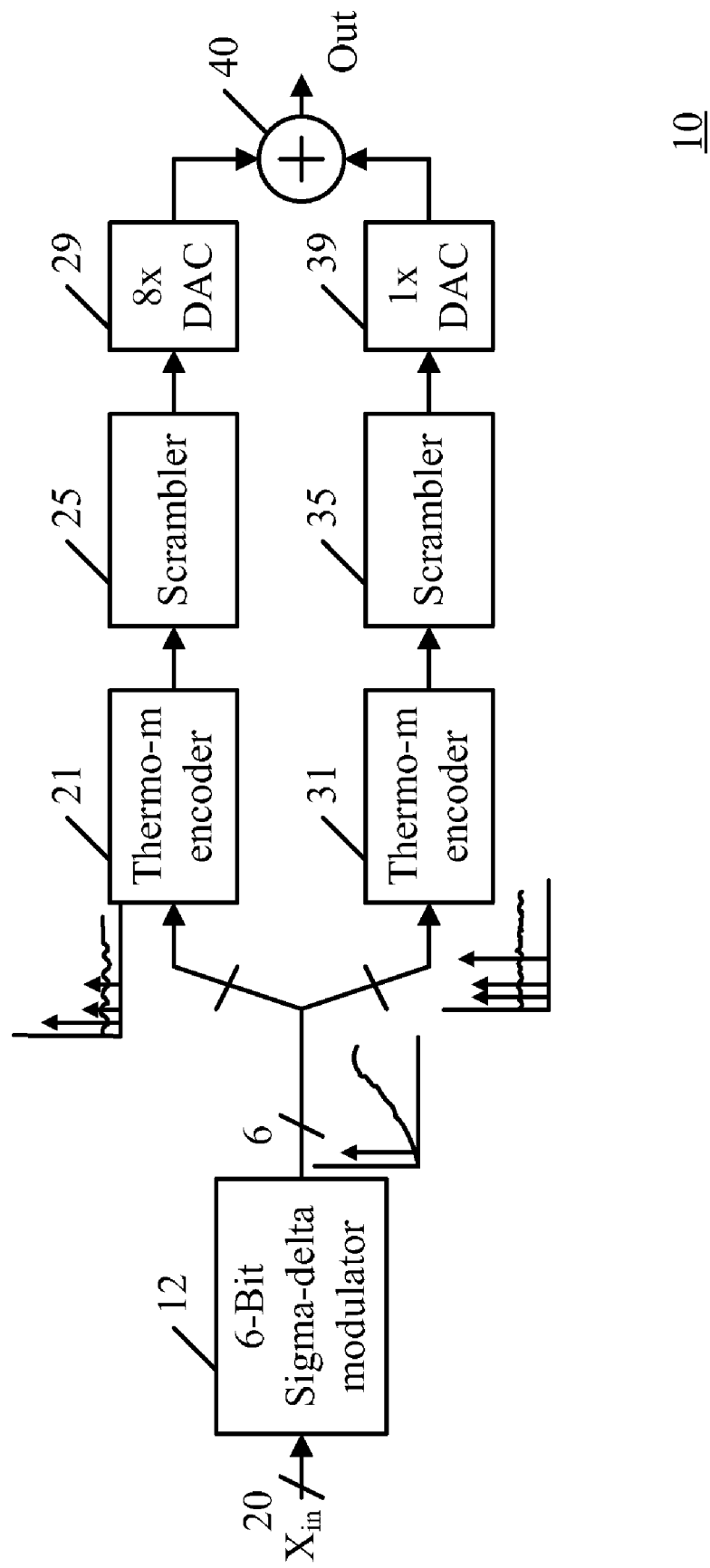
FIG. 1 is a block diagram schematically showing a prior art segmented DAC.
Figure 2:
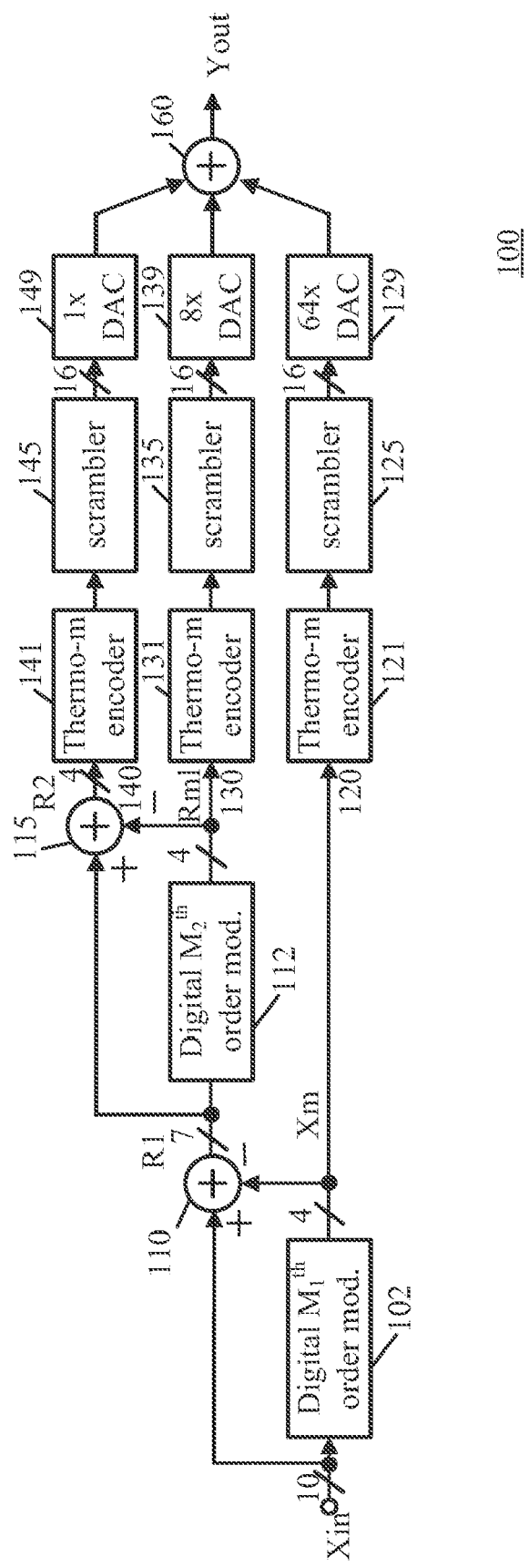
FIG. 2 is a block diagram schematically showing a segmented DAC in accordance with a first embodiment of the present invention.

FIG. 2 is a block diagram schematically showing a segmented DAC 100 in accordance with a first embodiment of the present invention. In the present embodiment, a 10-bit segmented DAC 100 is described as an example. A 10-bit input word Xin is passed through a first digital modulator 102 to be noise shaped. The first digital modulator 102 quantizes the input word Xin into a 4-bit noise shaped word Xm, which is referred to as a signal word or a first word, by using $M_1^{th}$ order noise transfer function (NTF). The 4-bit signal word Xm includes a signal component S and a noise N1 due to the first digital modulator 102. That is, the signal word Xm includes S and N1. Then the 4-bit signal word Xm is subtracted from the input word Xin (i.e. Xin−Xm) by a summing unit 110 to obtain a first residue word (or simply referred to as "first residue") R1. The first residue R1 will have a length of 7 bits. That is, the 10-bit input word Xin is split into a 4-bit signal word Xm and a 7-bit residue R1 with one bit overlapped. The first residue R1 comprises an inverse of the noise N1 generated by the first digital modulator 102. That is, the first residue R1 comprises $\overline{N1}$.

The 7-bit first residue R1 is further processed by a second digital modulator 112 to be quantized into a 4-bit noise shaped output Rm1, which is referred to as a noise word or a second word. The second digital modulator 112 quantizes the 7-bit first residue R1 into the 4-bit noise word Rm1 by using $M_2^{th}$ order NTF. Preferably, $M_1$ is greater than $M_2$ since the signal component is processed by the first digital modulator 102. However, the relationship between $M_1$ and $M_2$ is not limited to this. It is possible that $M_1=M_2$ or $M_1<M_2$. As can be known, the output Rm1 of the second digital modulator 112 comprises the inversed noise $\overline{N1}$ and a noise N2 generated by the second digital modulator 112. That is, the noise word Rm1 comprises $\overline{N1}$ and N2. The output Rm1 of the second digital modulator 112 is subtracted from the first residue R1 (i.e. R1−Rm1) by a summing unit 115 to obtain a second residue R2 of a length of 4 bits. That is, the 7-bit first residue R1 is further split into the 4-bit noise word Rm1 and the 4-bit second residue R2 with one bit overlapped. As can be seen, the second residue R2 comprises an inverse of the noise N2 of the second digital modulator 112. That is, the second residue R2 comprises $\overline{N2}$.

In this architecture, the 10 bit input word Xin is split into the 4-bit signal word Xm, the 4-bit noise word Rm1 and the 4-bit residue word R2 by three paths 120, 130 and 140. The 4-bit signal word Xm is processed by a thermometer encoder 121 and a scrambler 125 to be converted into 16 equally-weighted bits. The 4-bit noise word Rm1 is processed by a thermometer encoder 131 and a scrambler 135 to be converted into 16 equally-weighted and scrambled bits. The 4-bit residue word R2 is processed by a thermometer encoder 141 and a scrambler 145 to be converted into 16 equally-weighted bits. Then the above mentioned 16-bit words are respectively processed by DACs 129 (1×), 139 (8×) and 149 (64×) to generate corresponding analog values. For the DAC 129, the word length is quantized from 10-bit to 4-bit, so a 64× DAC is used. For the DAC 139, the word length is quantized from 7-bit to 4-bit, so an 8× DAC is used. For the DAC 149, a 1× DAC is used.

Each of the DACs 129, 139 and 149 is a 16-cell DAC since the word length is 16 bits. That is, each of the DACs 129, 139 and 149 comprises 16 DAC cells such as current sources or other analog elements. The DAC 100 only uses 48 (=16+16+16) DAC cells (e.g. current sources), which are analog elements, in all. It should be noted that when the bit numbers of signal word (such as Xm), the noise word (such as Rm1), and the second residue (R2) are more even, the amount of the DAC cell can be further reduced.

The output analog values of the three DACs 129, 139 and 149 are summed by a summing unit 160 to generate an analog output Yout. The gain mismatch between the DAC 129 and the DAC 139 is shaped by the $M_1^{th}$ order NTF of the first digital modulator 102, and the gain mismatch between the DAC 139 and the DAC 149 is shaped by the $M_2^{th}$ order NTF of the second digital modulator 112. Therefore, the impact on the in-band signal due to the gain mismatch can be reduced to the minimum.

If downlink current-steering DACs are used as the DACs 129, 139, 149 of such an architecture, assumed that an oversampling ratio (OSR) is 16, $M_1=M_2=1$, and the DAC ratio of the DACs 129, 139, 149 is adjusted as 1:7:49 on purpose for 1× DAC:8× DAC:64× DAC, we found performance of the DAC 100 is qualified in 1.92 MHz bandwidth by behavior simulation. The segmented DAC in accordance with the present invention has a great tolerance for gain mismatch.

As shown and described, the DAC 100 of the first embodiment includes three cascading stages with two digital modulators 102 and 112. In the first stage, the signal component is processed, and the noise component is further split into two portions to be respectively processed by the second and third stages. The first stage dealing with the signal component can be deemed as a preceding stage of the second stage dealing with the noise component. Thus, the first stage can be referred to as a signal component processing stage, while the second and third stages can be referred to as noise component processing stages. However, it is possible to use more stages to deal with the noise component so that the required number of the DAC cells can be further reduced.

Figure 3:
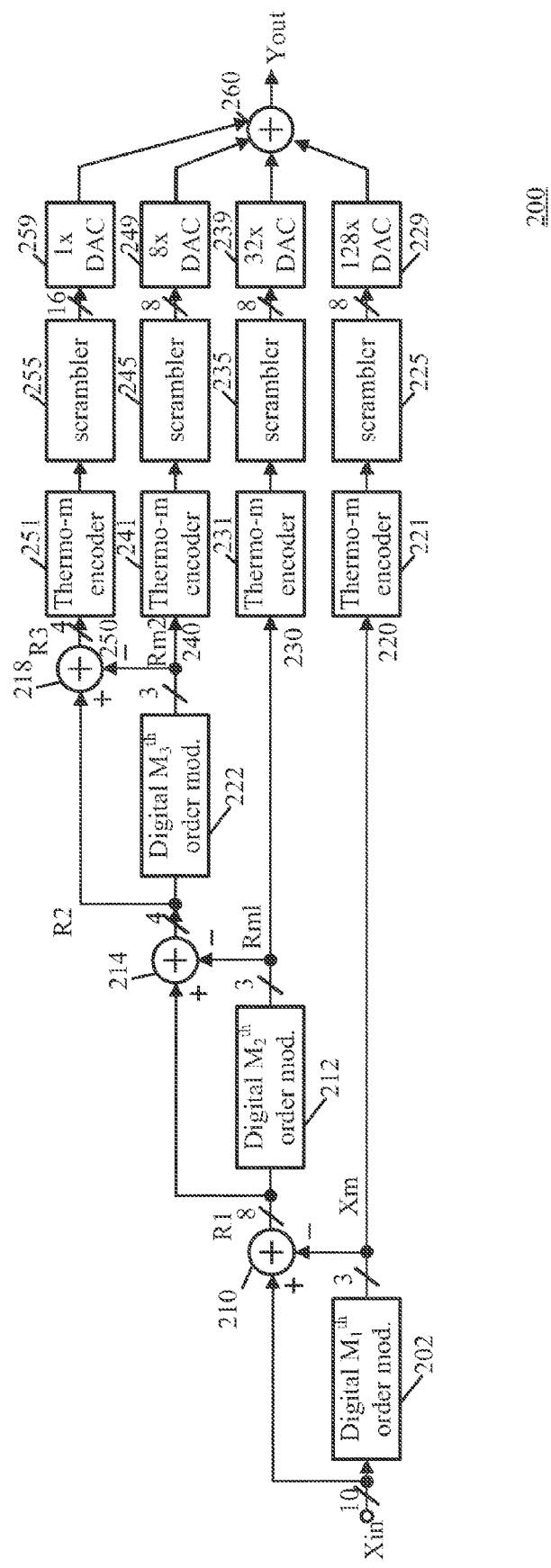
FIG. 3 is a block diagram schematically showing a segmented DAC in accordance with a second embodiment of the present invention.

FIG. 3 is a block diagram schematically showing a segmented DAC 200 in accordance with a second embodiment of the present invention. The architecture of the DAC 200 comprises four cascading stages. In the present example, a 10-bit word is split into 3 bits, 3 bits, 3 bits and 4 bits.

In the present embodiment, a 10-bit segmented DAC 200 is described as an example. A 10-bit input word Xin is passed through a first digital modulator 202. The first digital modulator 202 quantizes the input word Xin into a 3-bit word Xm, which is referred to as a signal word by using $M_1^{th}$ order noise transfer function (NTF). The 3-bit signal word Xm includes a signal component S and a noise N1 due to the first digital modulator 202. That is, the signal word Xm includes S and N1. Then the 3-bit signal word Xm is subtracted from Xin (i.e. Xin−Xm) by a summing unit 210 to obtain a first residue R1. The first residue R1 will have a length of 8 bits. That is, the 10-bit input word Xin is split into a 3-bit signal word Xm and an 8-bit residue R1 with one bit overlapped. The first residue R1 comprises an inverse of the noise N1 generated by the first digital modulator 202. That is, R1 comprises $\overline{N1}$.

The 8-bit first residue R1 is further processed by a second digital modulator 212 to be quantized into a 3-bit output Rm1, which is referred to a noise word. The second digital modulator 212 quantizes the 8-bit first residue R1 into the 3-bit noise word Rm1 by using $M_2^{th}$ order NTF. Preferably, $M_1$ is greater than $M_2$ since the signal component is process by the first digital modulator 202. However, the relationship between $M_1$ and $M_2$ is not limited to this. It is possible that $M_1=M_2$ or $M_1<M_2$. As can be known, the output Rm1 of the second digital modulator 212 comprises the inversed noise $\overline{N1}$ and a noise N2 generated by the second digital modulator 212. That is, the noise word Rm1 comprises $\overline{N1}$ and N2. The output Rm1 of the second digital modulator 212 is subtracted from the first residue R1 (i.e. R1−Rm1) by a summing unit 214 to obtain a second residue R2 of a length of 6 bits. That is, the 8-bit first residue R1 is further split into the 3-bit noise word Rm1 and the 6-bit second residue R2 with one bit overlapped. As can be seen, the second residue R2 comprises an inverse of the noise N2 of the second digital modulator 212. That is, the second residue R2 comprises $\overline{N2}$.

The 6-bit second residue R2 is further processed by a third digital modulator 222 to be quantized into a 3-bit output Rm2. The third digital modulator 222 quantizes the 6-bit second residue R2 into the 3-bit noise word Rm2 by using $M_3^{th}$ order NTF. Preferably, $M_1$ is greater than $M_3$ since the signal component is process by the first digital modulator 202. However, the relationship between $M_1$ and $M_3$ is not limited to this. It is possible that $M_1=M_3$ or $M_1<M_3$. As can be known, the output Rm2 of the third digital modulator 222 comprises the inversed noise $\overline{N2}$ and a noise N3 generated by the third digital modulator 222. That is, the noise word Rm2 comprises $\overline{N2}$ and N3. The output Rm2 of the third digital modulator 222 is subtracted from the second residue R2 (i.e. R2−Rm2) by a summing unit 218 to obtain a third residue R3 of a length of 4 bits. That is, the 6-bit second residue R2 is further split into the 3-bit noise word Rm2 and the 4-bit second residue R3 with one bit overlapped. As can be seen, the third residue R3 comprises an inverse of the noise N3 of the third digital modulator 222. That is, the third residue R3 comprises $\overline{N3}$.

In this architecture, the 10 bit input word is split into the 3-bit signal word Xm, the 3-bit noise word Rm1, the 3-bit noise word Rm2 and the 4-bit residue word R3 by four paths 220, 230, 240 and 250. The 3-bit signal word Xm is processed by a thermometer encoder 221 and a scrambler 225 to be converted into 8 equally-weighted bits. The 3-bit noise word Rm1 is processed by a thermometer encoder 231 and a scrambler 235 to be converted into 8 equally-weighted bits. The 3-bit noise word Rm2 is processed by a thermometer encoder 241 and a scrambler 245 to be converted into 8 equally-weighted bits. The 4-bit residue word R3 is processed by a thermometer encoder 251 and a scrambler 255 to be converted into 16 equally-weighted bits. Then the above mentioned words are respectively processed by DACs 229 (1×), 239 (8×), 249 (32×) and 259 (128×) to generate corresponding analog values. For the DAC 229, the word length is quantized from 10-bit to 3-bit, so a 128× DAC is used. For the DAC 239, the word length is quantized from 8-bit to 3-bit, so a 32× DAC is used. For the DAC 249, the word length is quantized from 6-bit to 3-bit, so an 8× DAC is used. For the DAC 259, a 1× DAC is used.

Each of the DACs 229, 239 and 249 is an 8-cell DAC since the word length is 8 bits. The DAC 259 is a 16-cell DAC since the word length is 16 bits. That is, each of the DACs 229, 239 and 249 comprises 8 DAC cells while the DAC 259 comprises 16 DAC cells such as current sources or other analog elements. The DAC 200 only uses 40 (=8+8+8+16) DAC cells in all.

The output analog values of the DACs 229, 239, 249 and 259 are summed by a summing unit 260 to generate an analog output Yout. The gain mismatch between the DAC 229 and the DAC 239 is noise shaped by the $M_1^{th}$ order NTF of the first digital modulator 202, the gain mismatch between the DAC 239 and the DAC 249 is shaped by the $M_2^{th}$ order NTF of the second digital modulator 212, and the gain mismatch between the DAC 249 and the DAC 259 is shaped by the $M_3^{th}$ order NTF of the third digital modulator 222. Therefore, the impact on the in-band signal due to the gain mismatch can be significantly reduced.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A segmented digital-to-analog converter comprising:
   a signal component processing stage having a first digital modulator for generating a first word in response to an input word according to an $M_1^{th}$ order noise transfer function, and a first DAC unit for converting the first word to generate a first analog value;
   a noise component processing stage comprising a second digital modulator for generating a second word in response to a first residue word obtained by subtracting the first word from the input word according to an $M_2^{th}$ NTF, a second DAC unit for converting the second word to generate a second analog value, and a third DAC unit for converting a second residue word obtained by subtracting the second word from the first residue word to generate a third analog value; and
   a summing unit summing the first analog value, the second analog value, and the third analog value to generate an output analog value.

2. The segmented digital-to-analog converter of claim 1, wherein the $M_1^{th}$ order NTF is a higher order NTF than the $M_2^{th}$ order NTF.

3. The segmented digital-to-analog converter of claim 1, wherein the first word and the second word are respectively noise shaped by the $M_1^{th}$ order NTF and the $M_2^{th}$ order NTF.

4. The segmented digital-to-analog converter of claim 1, further comprising thermometer encoders for the respective DAC units, each thermometer encoder converts the word to be sent to the DAC unit to generate a number of equally-weighted bits, the number is greater than a number of the bits of the word.

5. The segmented digital-to-analog converter of claim 4, further comprising scramblers for the respective DAC units, each scrambler randomly scrambles the equally-weighted bits to generate scrambled bits and output the scrambled bits to the DAC unit.

6. The segmented digital-to-analog converter of claim 1, wherein the noise component processing stage comprises a first summing unit for subtracting the first word from the input word to obtain the first residue word, and a second summing unit for subtracting the second word from the first residue word to obtain a second residue word.

7. A segmented digital-to-analog converter (DAC) comprising:
   a signal component processing stage having a first digital modulator for generating a first word in response to an input word according to an $M_1^{th}$ order noise transfer function (NTF), and a first DAC unit for converting the first word to generate a first analog value;
   a first noise component processing stage comprising a second digital modulator for generating a second word in response to a first residue obtained by subtracting the first word from the input word according to an $M_2^{th}$ NTF, and a second DAC unit for converting the second word to generate a second analog value;
   a second noise component processing stage comprising a third digital modulator for generating a third word in response to a second residue word obtained by subtracting the second word from the first residue word according to an $M_3^{th}$ NTF, a third DAC unit for converting the third word to generate a third analog value, and a fourth DAC unit for converting a third residue word obtained by subtracting the third word from the second residue word to generate a fourth analog value; and
   a summing unit for summing the first analog value, the second analog value, the third analog value and the fourth analog value to generate an output analog value.

8. The segmented digital-to-analog converter of claim 7, wherein the $M_1^{th}$ order NTF is a higher order NTF than the $M_2^{th}$ order NTF, and the $M_1^{th}$ order NTF is a higher order NTF than the $M_3^{th}$ order NTF.

9. The segmented digital-to-analog converter of claim 7, wherein the first word, the second word and the third word are respectively noise shaped by the $M_1^{th}$ order NTF, the $M_2^{th}$ order NTF and the $M_3^{th}$ order NTF.

10. The segmented digital-to-analog converter of claim 7, further comprising thermometer encoders for the respective DAC units, each thermometer encoder converts the word to be sent to the DAC unit to generate a number of equally-weighted bits, the number is greater than a number of the bits of the word.

11. The segmented digital-to-analog converter of claim 10, further comprising scramblers for the respective DAC units, each scrambler randomly scrambles the equally-weighted bits to generate scrambled bits and output the scrambled bits to the DAC unit.

12. The segmented digital-to-analog converter of claim 7, wherein the first noise component processing stage comprises a first summing unit for subtracting the first word from the input word to obtain the first residue word, the second noise component processing stage comprises a second summing unit for subtracting the second word from the first residue word to obtain a second residue word and a third summing unit for subtracting the third word from the second residue word to obtain a third residue word.

13. A segmented digital-to-analog converter (DAC) comprising:
   a signal component processing stage having a digital modulator for generating a signal word in response to an input word and a DAC unit for converting the signal word to generate an analog value;
   a plurality of noise component processing stages cascaded with the signal component processing stage so that the signal component processing stage is a preceding stage with respect to the first one of the noise component processing stages, each noise component processing stage comprising:
- a digital modulator generating a noise word in response to a residue word obtained by subtracting an output of the digital modulator of a preceding stage from an input of the preceding stage, and
- a DAC unit converting the noise word to generate an analog value,
- wherein the last one of the noise component processing stages further comprises another DAC unit for converting a residue obtained by subtracting an output of the digital modulator of the preceding stage from an input of the preceding stage to generate an analog value; and
- a summing unit summing all the analog values to generate an output analog value.

14. The segmented digital-to-analog converter of claim 13, further comprising thermometer encoders for the respective DAC units, each thermometer encoder converts the word to be sent to the DAC unit to generate a number of equally-weighted bits, the number is greater than a number of the bits of the word.

15. The segmented digital-to-analog converter of claim 14, further comprising scramblers for the respective DAC units, each scrambler randomly scrambles the equally-weighted bits to generate scrambled bits and output the scrambled bits to the DAC unit.

16. The segmented digital-to-analog converter of claim 13, wherein the noise component processing stage comprises a plurality of summing units, each subtracts the output of the digital modulator of the preceding stage from the input of the same digital modulator to obtain the residue word.

17. A segmented digital-to-analog converter comprising:
- a first processing stage having a first digital modulator for generating a first word in response to an input word according to an $M_1^{th}$ order noise transfer function, and a first DAC unit coupling the first word to generate a first analog value;
- a second processing stage comprising a second digital modulator for generating a second word in response to a first residue word obtained by subtracting the first word from the input word according to an $M_2^{th}$ NTF, a second DAC unit for coupling the second word to generate a second analog value, and a third DAC unit for coupling a second residue word obtained by subtracting the second word from the first residue word to generate a third analog value; and
- a summing unit summing the first analog value, the second analog value, and the third analog value to generate an output analog value.

* * * * *